(12) United States Patent
Kolar et al.

(10) Patent No.: US 10,902,893 B2
(45) Date of Patent: *Jan. 26, 2021

(54) NEGATIVE BITLINE WRITE ASSIST CIRCUIT AND METHOD FOR OPERATING THE SAME

(71) Applicant: Intel Corporation, Santa Clara, CA (US)

(72) Inventors: Pramod Kolar, Hillsboro, OR (US); John Riley, Hillsboro, OR (US); Gunjan Pandya, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/809,647

(22) Filed: Nov. 10, 2017

(65) Prior Publication Data

US 2018/0082722 A1 Mar. 22, 2018

Related U.S. Application Data

(63) Continuation of application No. 15/162,477, filed on May 23, 2016, now Pat. No. 9,818,460, which is a continuation of application No. 13/997,591, filed as application No. PCT/US2012/029286 on Mar. 15, 2012, now Pat. No. 9,378,788.

(51) Int. Cl.
*G11C 7/12* (2006.01)
*G11C 7/10* (2006.01)
*G11C 7/22* (2006.01)
*G11C 11/413* (2006.01)
*G11C 11/419* (2006.01)

(52) U.S. Cl.
CPC ............... *G11C 7/12* (2013.01); *G11C 7/10* (2013.01); *G11C 7/1096* (2013.01); *G11C 7/22* (2013.01); *G11C 11/413* (2013.01); *G11C 11/419* (2013.01)

(58) Field of Classification Search
CPC .... G11C 7/12; G11C 7/10; G11C 7/22; G11C 7/1096; G11C 11/413; G11C 11/419
See application file for complete search history.

(56) References Cited

U.S. PATENT DOCUMENTS

| 4,010,453 A | 3/1977 | Lewis |
| 4,387,448 A | 6/1983 | Takemae |
| 4,404,661 A | 9/1983 | Nagayama |

(Continued)

OTHER PUBLICATIONS

"A 2-port 6T SRAM bitcell design with multi-port capabilities at reduced area overhead"; Jawar Singh, Dilip S. Aswar, Saraju P. Mohanty and Dhiraj K. Pradhan; Published in Mar. 2010 Quality Electronic Design (ISQED, 2010 11th International Symposium).

(Continued)

*Primary Examiner* — Mushfique Siddique
(74) *Attorney, Agent, or Firm* — Green, Howard & Mughal LLP

(57) ABSTRACT

A negative bitline write assist circuit includes a bias capacitor configured to facilitate driving the capacitance of a bitline. The negative bitline write assist circuit may be modularly replicated within a circuit to change the amount of negative voltage on the bitline during write operations. The bitline write assist circuit may be coupled directly to the bitline, removing the need to add a pull-down transistor to the write driver.

21 Claims, 4 Drawing Sheets

(56) References Cited

U.S. PATENT DOCUMENTS

| | | | |
|---|---|---|---|
| 4,513,399 | A | 4/1985 | Tobita |
| 6,031,754 | A | 2/2000 | Derbenwick |
| 6,337,824 | B1 | 1/2002 | Kono |
| 6,654,295 | B2 | 11/2003 | Leung |
| 8,233,342 | B2 | 7/2012 | Adams |
| 8,363,453 | B2 | 1/2013 | Arsovski |
| 8,411,518 | B2 | 4/2013 | Janardan et al. |
| 8,441,874 | B2 | 5/2013 | Sinha |
| 8,467,251 | B2 | 6/2013 | LaRosa |
| 8,837,229 | B1 | 9/2014 | Dubey |
| 9,070,432 | B2 | 6/2015 | Hsieh |
| 9,378,788 | B2 | 6/2016 | Kolar |
| 9,401,201 | B1 | 7/2016 | Jung |
| 9,460,778 | B2 | 10/2016 | Son et al. |
| 9,837,144 | B1* | 12/2017 | Sinha .................. G11C 7/1009 |
| 9,875,790 | B1 | 1/2018 | Sinha et al. |
| 2005/0122809 | A1 | 6/2005 | Kim |
| 2006/0268626 | A1 | 11/2006 | Hamzaoglu |
| 2007/0081379 | A1* | 4/2007 | Clinton ................. G11C 11/419 365/149 |
| 2007/0268738 | A1 | 11/2007 | Heinrich-Bama et al. |
| 2009/0168496 | A1* | 7/2009 | Mikan, Jr. ............. G11C 11/412 365/154 |
| 2009/0235171 | A1 | 9/2009 | Adams |
| 2010/0182865 | A1 | 7/2010 | Wu |
| 2010/0188909 | A1 | 7/2010 | Kenkare et al. |
| 2010/0232244 | A1* | 9/2010 | Hirabayashi ............. G11C 7/12 365/208 |
| 2011/0069574 | A1* | 3/2011 | Hirabayashi .......... G11C 11/413 365/226 |
| 2011/0149667 | A1* | 6/2011 | Hamzaoglu ........... G11C 11/412 365/203 |
| 2011/0235444 | A1* | 9/2011 | Chuang ................ G11C 11/413 365/189.16 |
| 2011/0267901 | A1 | 11/2011 | Yang et al. |
| 2012/0170391 | A1* | 7/2012 | Janardan ................. G11C 7/04 365/194 |
| 2012/0206988 | A1 | 8/2012 | Song |
| 2012/0314486 | A1 | 12/2012 | Yoshimoto et al. |
| 2013/0148438 | A1 | 6/2013 | Chen |
| 2014/0050033 | A1 | 2/2014 | Otto et al. |
| 2014/0160871 | A1 | 6/2014 | Zimmer |
| 2014/0312956 | A1 | 10/2014 | Hold et al. |
| 2016/0203857 | A1* | 7/2016 | Chandra ............... G11C 11/419 365/156 |
| 2017/0117034 | A1* | 4/2017 | Hebig ................... G11C 11/419 |

OTHER PUBLICATIONS

Final Office Action for U.S. Appl. No. 15/162,477, dated Apr. 21, 2017.
Final Office Action dated Aug. 19, 2015, for U.S. Appl. No. 13/997,591, 28 pages.
International Preliminary Report on Patentability dated Sep. 25, 2014, for PCT Application No. PCT/US2012/029286, 8 pages.
International Search Report and Written Opinion dated Nov. 28, 2012, for PCT Application No. PCT/US2012/029286, 9 pages.
Non-Final Office Action for U.S. Appl. No. 15/162,477, dated Sep. 13, 2016.
Non-Final Office Action dated Feb. 20, 2015, for U.S. Appl. No. 13/997,591, 31 pages.
Notice of Allowance for U.S. Appl. No. 15/162,477, dated Jul. 14, 2017.
Notice of Allowance dated Mar. 1, 2016, for U.S. Appl. No. 13/997,591, 11 pages.
www.wikipedia.org; Jan. 17, 2015 updated version (Webpage snapshot/capture date Jan. 21, 2015).
Non-Final Office Action for U.S. Appl. No. 15/854,549, dated May 14, 2018.
Final Office Action dated Nov. 27, 2018 for U.S. Appl. No. 15/854,549.
Advisory Action dated Feb. 14, 2019 for U.S. Appl. No. 15/854,549.
Non-Final Office Action dated May 29, 2019 for U.S. Appl. No. 15/854,549.
Advisory Action dated Dec. 31, 2019 for U.S. Appl. No. 15/854,549.
Final Office Action dated Oct. 18, 2019 for U.S. Appl. No. 15/854,549.
Non-Final Office Action dated Feb. 3, 2020 for U.S. Appl. No. 15/854,549.
Notice of Allowance dated Jun. 5, 2020 for U.S. Appl. No. 15/854,549.

* cited by examiner

NEGATIVE BITLINE WRITE ASSIST CIRCUIT AND METHOD FOR OPERATING THE SAME

CROSS REFERENCE TO RELATED APPLICATIONS

The present application is a continuation of, and claims priority to U.S. application Ser. No. 15/162,477, filed May 23, 2016, issued as U.S. Pat. No. 9,818,460 on Nov. 14, 2017, and titled "NEGATIVE BITLINE WRITE ASSIST CIRCUIT AND METHOD FOR OPERATING THE SAME" which is a continuation of, and claims priority to U.S. application Ser. No. 13/997,591, filed Jun. 24, 2013, entitled "NEGATIVE BITLINE WRITE ASSIST CIRCUIT AND METHOD FOR OPERATING THE SAME", issued as U.S. Pat. No. 9,378,788, on Jun. 28, 2016, which is a national phase entry under 35 U.S.C. § 371 of, and claims priority to International Application No. PCT/US2012/029286, filed Mar. 15, 2012, entitled "NEGATIVE BITLINE WRITE ASSIST CIRCUIT AND METHOD FOR OPERATING THE SAME", which designated, among the various States, the United States of America. The disclosures of the PCT/US2012/029286, U.S. patent application Ser. No. 13/997,591, and U.S. patent application Ser. No. 15/162,477 applications are hereby incorporated by reference.

TECHNICAL FIELD

The present disclosure relates generally to electronic circuits, and in particular but not exclusively relates to a negative bitline write assist circuit.

BACKGROUND INFORMATION

Bitlines are conductive lines or traces that may couple a memory cell write driver to a memory cell to be written. Bitlines may capacitively load a write driver and decrease the slew rate of data transmitted over the bitline. The more memory cells are coupled to the write driver, the longer the bitlines may be and the larger the capacitance of the bitline may become.

In dual port memory cells, the conventional use of supply collapse-based write assist techniques result in functional failure. As another example, in single port SRAMs, conventional negative voltage bitline techniques may use a large pull-down transistor to provide a negative voltage supply or ground reference for the write driver. The pull-down transistor used in conventional approaches may be large to ensure that write data slew remains within acceptable limits and the virtual ground voltage of the write driver is close to Vss. However, a large pull-down transistor increases the area of the write driver, thereby consuming valuable silicon real estate.

An additional drawback of conventional approaches to negative voltage bitline techniques is that the designs may not be modular. In other words, modifications to the design to compensate for process variations and/or increases in the number of memory cells (and bitlines) may necessitate post-silicon tuning with programmable capacitors and pass/transmission gates to support programming. These additional components further add to the consumption of silicon real estate while adding additional parasitic resistances.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Embodiments disclosed herein are directed towards a negative bitline write assist circuit. Part of the circuit couples to the memory bitline(s) and enables negative bitline write driving without the use of a large pull-down transistor within or directly coupled to a write driver. In one embodiment, the negative bitline write assist circuit may offer better performance than traditional negative bitline write assist circuits while consuming a fraction of the silicon real estate.

Various aspects of the illustrative embodiments will be described using terms commonly employed by those skilled in the art to convey the substance of their work to others skilled in the art. However, some alternate embodiments may be practiced using portions of the described aspects. For purposes of explanation, specific numbers, materials, and configurations are set forth in order to provide a thorough understanding of the illustrative embodiments. However, alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

As used herein, a logic level HIGH may correspond to any one of a voltage in the range of 0.5 to 1 volts, 0.7 to 1.2 volts, 1 to 3 volts, 1 to 5 volts, 3 to 15 volts, or other voltage or other signal level. Additionally, a logic level LOW may correspond to any one of a voltage in the range of 0 to 0.5 volts, −0.5 to 0.4 volts, −15 to 0 volts, or other voltage or other signal level. Additionally, a switch that is turned ON is considered to be electrically conductive between at least two conductive terminals of the switch, and a switch that is turned OFF is considered to be electrically non-conductive between the terminals.

Figure 1:
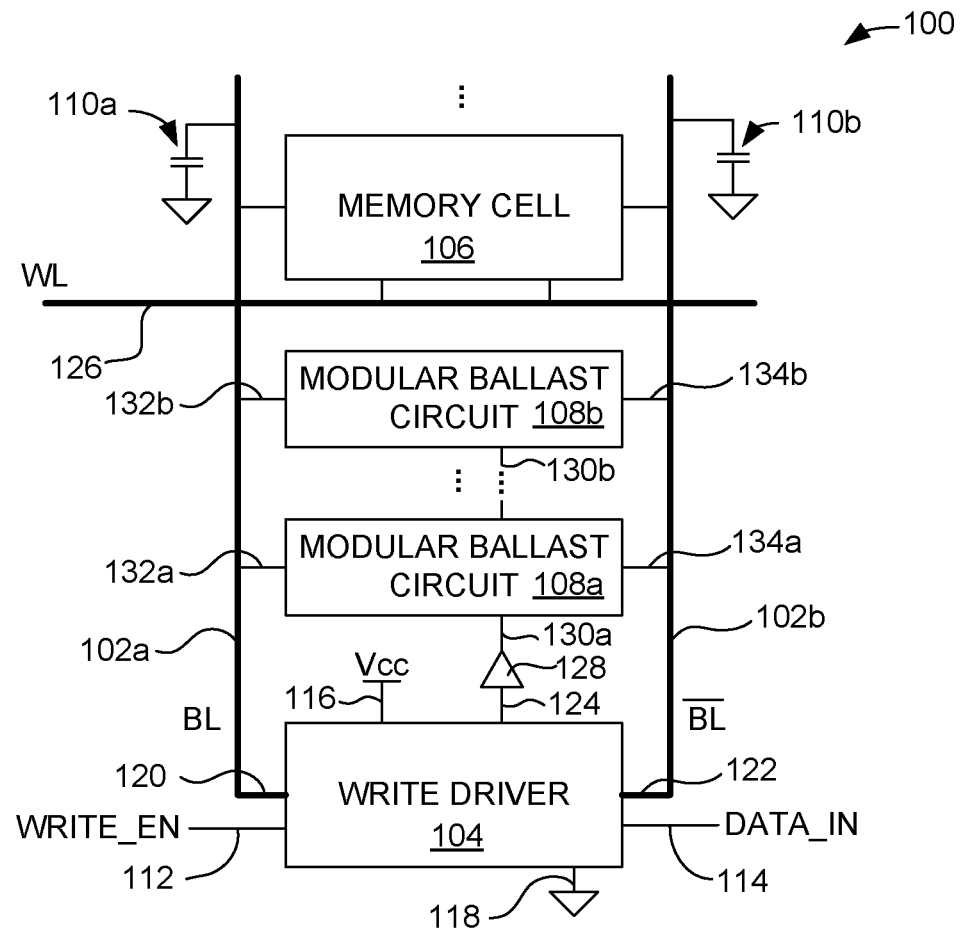
FIG. 1 is a block diagram of a memory circuit, according to one embodiment.

FIG. 1 illustrates a memory circuit 100 suitable for practicing embodiments. As will be described in more detail below, memory circuit 100 may be configured to use one or more modular ballast circuits to drive a bitline negative or to facilitate a timely discharge of one or more bitlines. As shown, memory circuit 100 may include one or more bitlines 102a, 102b (collectively, 102), a write driver 104, a memory cell 106, and one or more modular ballast circuits 108a, 108b (collectively, 108).

One or more bitlines 102 may be conductive lines or traces configured to provide a low resistance path between write driver 104 and memory cell 106. One or more bitlines 102 may have a (parasitic) capacitance 110a and a capacitance 110b (collectively, 110). The capacitance 110 may vary, for example, as a function of the length, the width, and the thickness of one or more bitlines 102.

Various performance-related trade-offs may be considered while determining the dimensions of one or more bitlines 102. Some of the trade-offs may include accepting a lower resistance of one or more bitlines 102 in exchange for a higher capacitance, and vice versa. Additionally, higher numbers of memory cells 106 coupled to one or more bitlines 102 may result in longer, thus more capacitive, bitlines 102.

Through the slew rate, the capacitance 110 of one or more bitlines 102 may at least partially determine the maximum frequency at which memory cell 106 may be operated. Generally, slew rate is the maximum rate of change of voltage as a function of time on one or more bitlines 102. The slew rate of one or more bitlines 102 is affected by capacitance 110 because a higher capacitance 110 corresponds with a higher RC time constant, i.e., slower charge and discharge times, for one or more bitlines 102. As result, capacitance 110 may define an upper limit on the frequency at which data bits may be switchably transmitted on to one or more bitlines 102.

Write driver 104 may be configured to drive one or more bitlines 102 in response to various input signals. Write driver 104 may include a first input terminal 112, a second input terminal 114, a voltage input terminal 116, a ground reference terminal 118, a bitline terminal 120, a bitline bar terminal 122, and a ballast drive terminal 124. Voltage input terminal 116 may be coupled to a voltage reference VCC, and ground reference terminal 118 may be coupled to ground, as shown. According to one embodiment, first input terminal 112 may be configured to receive a write enable signal WRITE_EN, and second input terminal 114 may be configured to receive a data signal DATA_IN. Write driver 104 may be configured to drive bitline 102a with a logic level corresponding to a logic level received at the second input terminal 114 by data signal DATA_IN. Write driver 104 may also be configured to drive bitline 102b with a logic level opposite to the logic level received at the second input terminal 114 by data signal DATA_IN. Accordingly, write driver 104 may be configured to drive bitline 102a and bitline 102b with opposing logic levels.

Write driver 104 may be configured to drive one or more bitlines 102 in response to logical combinations of write enable signal WRITE_EN and data signal DATA_IN. According to one embodiment, write driver 104 may be configured to drive a logic level HIGH onto bitline 102a in response to concurrently receiving a logic level HIGH write enable signal WRITE_EN and a logic level HIGH data signal DATA_IN. Write driver 104 may also be configured to float one or more bitlines 102 in response to receiving a logic level LOW write enable signal WRITE_EN at the first terminal 112. According to one embodiment, write driver 104 floats one or more bitlines 102 by switchably decoupling one or more bitlines 102 from ground reference terminal 118 and from voltage input terminal 116.

Write driver 104 may additionally drive ballast drive terminal 124 to operate modular ballast circuits 108. According one embodiment, a buffer 128 may be coupled between the ballast drive terminal 124 and modular ballast circuits 108 to delay the ballast drive signal transmitted by write driver 104. According to another embodiment, ballast drive terminal 124 is directly coupled or connected to first input terminal 112 to provide write enable signal WRITE_EN to buffer 128.

According to other embodiments, write driver 104 includes a circuitry for selectively driving a modular ballast circuit.

Memory cell 106 may be coupled to receive one or more bits of data from write driver 104 through one or more bitlines 102. Memory cell 106 may be volatile memory such as random access memory (RAM), or may be non-volatile memory such as an electronically erasable programmable read-only memory (EEPROM). According to one embodiment, memory cell 106 is a six-transistor (6t) SRAM. According to another embodiment, memory cell 106 is a a dual port SRAM In operation, memory cell 106 may be enabled by a word line (WL) 126 to enable memory cell 106 to access one or more bitlines 102. According to one embodiment, memory cell 106 may be enabled by multiple wordlines 126, such as in a dual port memory cell. While memory cell 106 accesses one or more bitlines 102, memory cell 106 may provide data to one or more bitlines 102 or may receive data from one or more bitlines 102, according to various embodiments. One memory cell 106 is shown for illustration purposes, however, memory circuit 100 may include tens, hundreds, thousands, or other number of memory cells 106 coupled between one or more bitlines 102, according to various embodiments Modular ballast circuits 108a, 108b (collectively, 108) may be electrically coupled between bitline 102a and bitline 102b to facilitate discharging and/or charging capacitance 110 of one or more bitlines 102. According to one embodiment, modular ballast circuits 108 may be connected to one or more bitlines 102a, 102b. According to another embodiment, modular ballast circuits 108 may be coupled to one or more bitlines 102a, 102b such that only passive electronic components (e.g., resistors, inductors, or the like) are between each of modular ballast circuits 108 and one or more bitlines 102a, 102b. Modular ballast circuits 108 may be configured to be bitline write assist circuits. Modular ballast circuits 108 may include circuitry for selectively driving one or more bitlines 102 negative and/or may include circuitry for selectively discharging and/or charging one or more bitlines 102. Modular ballast circuits 108 may include input terminals 130a, 130b (collectively, 130) and output terminals 132a, 132b, 134a, 134b (collectively 132, 134). Input terminals 130 may be coupled or connected to receive a buffered ballast drive signal from buffer 128. In response to the buffered ballast drive signal from write driver 104, modular ballast circuits 108 may be configured to selectively alter the logic level of bitline 102a, bitline 102b, or both of bitlines 102 concurrently. According one embodiment, modular ballast circuits 108 may be configured as charge pumps capable of rapidly driving one of output terminals 132, 134 negative, in response to a logic level change at input terminals 130. As a result, modular ballast circuits 108 may alter the logic level of one of bitlines 102 by injecting or extracting charge from one of capacitances 110 through capacitive charge sharing.

The disclosed configuration of modular ballast circuits 108 provides several features for memory circuit 100. First, directly coupling or connecting modular ballast circuits 108 to one or more bitlines 102 enables modular ballast circuits 108 to be modularly expanded or contracted in quantity.

While two modular ballast circuits 108 are shown in FIG. 1, only one modular ballast circuit 108 may be used, or several modular ballast circuits 108 may be used to suitably match the driving capacity of modular ballast circuits 108 with capacitance 110 of one or more bitlines 102. According to another embodiment, multiple modular ballast circuits 108 may be included in the memory circuit 100 and one or more modular ballast circuits 108 are enabled by post silicon tuning or through die-by-die programming.

Second, as a result of the configuration of modular ballast circuits 108, write driver 104 may be directly coupled or connected to ground through ground reference terminal 118. This configuration may be distinguished from conventional negative bitline write drivers because conventional negative bitline memory write drivers are coupled to ground through a large pull-down transistor. By eliminating the use of a large pull-down transistor, the configuration of the present disclosure enables manufacture of a smaller device. According to one embodiment, each modular ballast circuit 108 employs transistors which consume ~96% (for example) less transistor area, provides approximately a 118 mV negative output voltage, and provides smaller shifts across process skews than conventional negative bitline write assist circuits.

Figure 2:
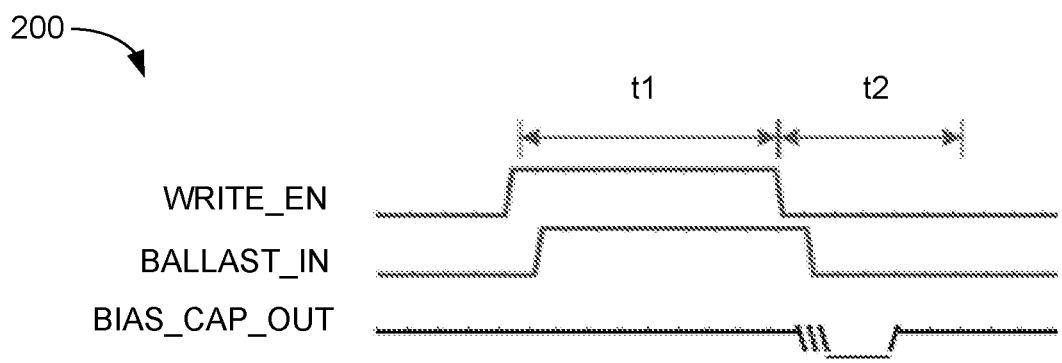
FIG. 2 is a timing diagram related to the operation of the memory circuit of FIG. 1, according to one embodiment.

FIG. 2 illustrates a timing diagram 200 showing a negative bitline write operation of memory circuit 100, according to one embodiment.

In a first time segment t1, write enable signal WRITE_EN has transitioned from logic level LOW to logic level HIGH. A buffered ballast drive signal BALLAST_IN transitions from a logic level LOW to the logic level HIGH in response to the LOW to HIGH transition of write enable signal WRITE_EN. According to one embodiment, during the first time segment t1, bitline 102a is driven to logic level LOW and is coupled to output ballast signal BALLAST_OUT through output terminal 132a, as an example.

In a second time segment t2, write enable signal WRITE_EN has transitioned from logic level HIGH to logic level LOW to float or decouple bitlines 102 from write driver 104. A buffered ballast drive signal BALLAST_IN transitions from a logic level HIGH to the logic level LOW in response to the HIGH to LOW transition of write enable signal WRITE_EN. Modular ballast circuit 108a then provides a negative output ballast signal BALLAST_OUT to output terminal 132a, for example, in response to the HIGH to LOW transition of buffered ballast drive signal BALLAST_IN. As a result, the output ballast signal BALLAST_OUT drives bitline 102a to a negative voltage to perform a negative bitline write assist, according to one embodiment.

Figure 3:
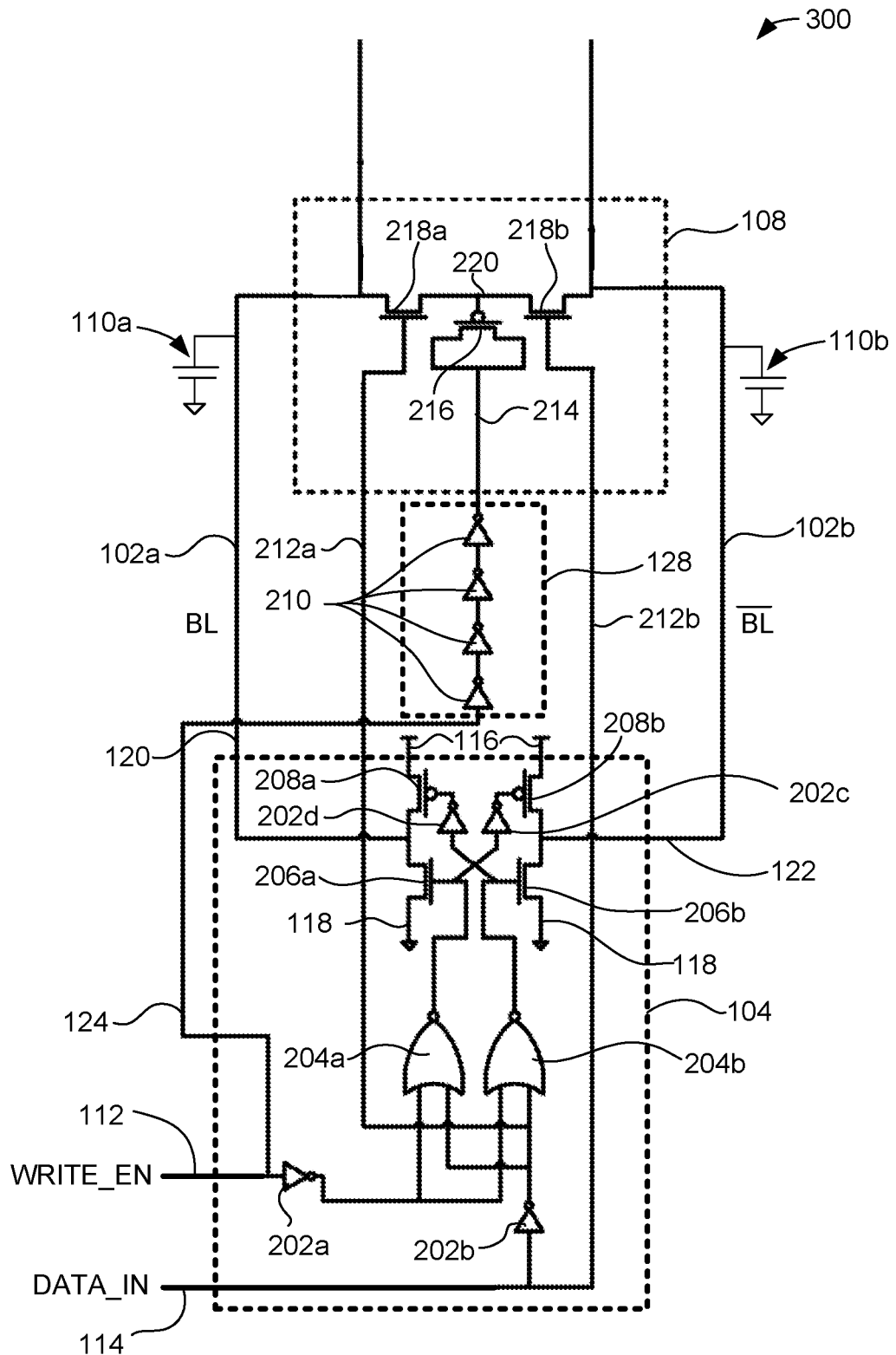
FIG. 3 is a schematic diagram of the memory circuit of FIG. 1, according to one embodiment.

FIG. 3 illustrates details of a memory circuit 300 suitable for practicing embodiments of the present disclosure. Memory circuit 300 may be an example of an implementation of memory circuit 100, according to one embodiment. Memory circuit 300 may include one or more bitlines 102, write driver 104, and modular ballast circuit 108. Components and features that are similar between various figures may be referenced with the same or similar reference numbers. Accordingly, the description provided above for some of the components and features referenced in FIG. 3 will not be repeated.

Write driver 104 may be configured to drive one or more bitlines 102 using a plurality of electronic components. Write driver 104 may include a number of inverters 202a, 202b, 202c, 202d (collectively, 202), logic gates 204a, 204b, metal-oxide semiconductor field-effect transistors (MOSFETs) 206a, 206b (collectively, 206), and MOSFETs 208a, 208b (collectively, 208). In operation, while receiving a logic level LOW at first input terminal 112, write driver 104 may disable or turn OFF MOSFETs 206 and MOSFETs 208 to float or decouple one or more bitlines 102 from voltage input terminal 116 and ground reference terminal 118. While receiving a logic level HIGH at first input terminal 112, one or more MOSFETs 206 and MOSFETs 208 may be turned ON to drive one or more bitlines 102, according one embodiment. Additionally, write driver 104 may selectively enable or turn ON one or more MOSFETs 206 and MOSFETs 208 in response to receiving data signal DATA_IN at second input terminal 114.

As shown, first input terminal 112 may be configured, coupled, or directly connected to drive buffer 128. Buffer 128 may include a plurality of inverters 210. According one embodiment, buffer 128 includes four inverters. According to another embodiment, buffer 128 includes several more or less inverters 210 to determine a delay between write enable signal WRITE_EN at first input terminal 112 and a bias capacitor input signal BIAS_CAP_IN at a bias capacitor input terminal 214. Buffer 128 may include circuitry for determining a delay between write driver 104 and modular ballast circuit 108. According to one embodiment, the delay of buffer 128 is programmable. The delay may be programmed by switchably coupling and decoupling inverters 210 between write driver 104 and first input terminal 112.

Data signal DATA_IN may concurrently perform multiple functions. Data signal DATA_IN, as discussed above, may determine the logic level to be driven on one or more bitlines 102. Additionally, data signal DATA_IN may drive one or more multiplexer (MUX) control lines 212a, 212b (collectively, 212). One or more MUX control lines 212 may be coupled or connected to multiplexing switches within the modular ballast circuit 108, according to one embodiment.

As discussed in connection with FIG. 1, modular ballast circuit 108 may be configured to discharge at least one of capacitances 110 in order to transition at least one of bitlines 102 from a logic level HIGH to a logic level LOW. Modular ballast circuit 108 may also be configured to selectively drive a negative voltage onto one or more capacitances 110. Modular ballast circuit 108 may include a bias capacitor 216, MUX switches 218a, 218b (collectively, 218), and a bias capacitor output terminal 220.

Bias capacitor 216 may be configured to pump or transfer charge from bias capacitor input terminal 214 to bias capacitor output terminal 220. According to one embodiment, bias capacitor 216 is a p-channel MOSFET having source and drain terminals conductively coupled together as bias capacitor input terminal 214. According to other embodiments, capacitor 216 is an n-channel MOSFET, a metal capacitor, or a metal-insulator-metal capacitor (MIMcap). Because a capacitor does not allow an instantaneous change in an electrical potential difference, e.g., a voltage, that is across the terminals of the capacitor, a rapid transition of the logic level on bias capacitor input terminal 214 may produce a voltage that is beyond the range of voltage reference VCC and/or the ground reference. For example, bias capacitor 216 may generate or provide a negative voltage at bias capacitor output terminal 220. According to one embodiment, the capacitance of bias capacitor 216 is smaller than each one of capacitances 110. An illustrative example of the operation of bias capacitor 216 will be provided in connection with FIG. 4.

MUX switches 218 may be coupled or positioned between MUX control lines 212 and bias capacitor 216 to selectively couple the capacitor 216 to the one or more bitlines 102, according to one embodiment. MUX switches 218 may each have a first conductive state and a second conductive state. The first conductive state may substantially conduct current and the second conductive state may substantially impede current. MUX switches 218 may be n-channel MOSFETs that are configured to provide a conductive path between the bias capacitor output terminal 220 and at least one of bitlines 102 while a logic level HIGH is applied to a respective one of the MUX control lines 212. For example, while data signal DATA_IN is a logic level LOW, a logic level HIGH may be driven onto MUX control line 212a by the write driver 104. The logic level HIGH on MUX control line 212a may turn ON MUX switch 218a so that MUX switch 218a conductively and electrically couples bias capacitor output terminal 220 to bitline 102a. Concurrently, while data signal DATA_IN is a logic level LOW, MUX switch 218b may electrically decouple bias capacitor output terminal 220 from bitline 102b.

Figure 4:
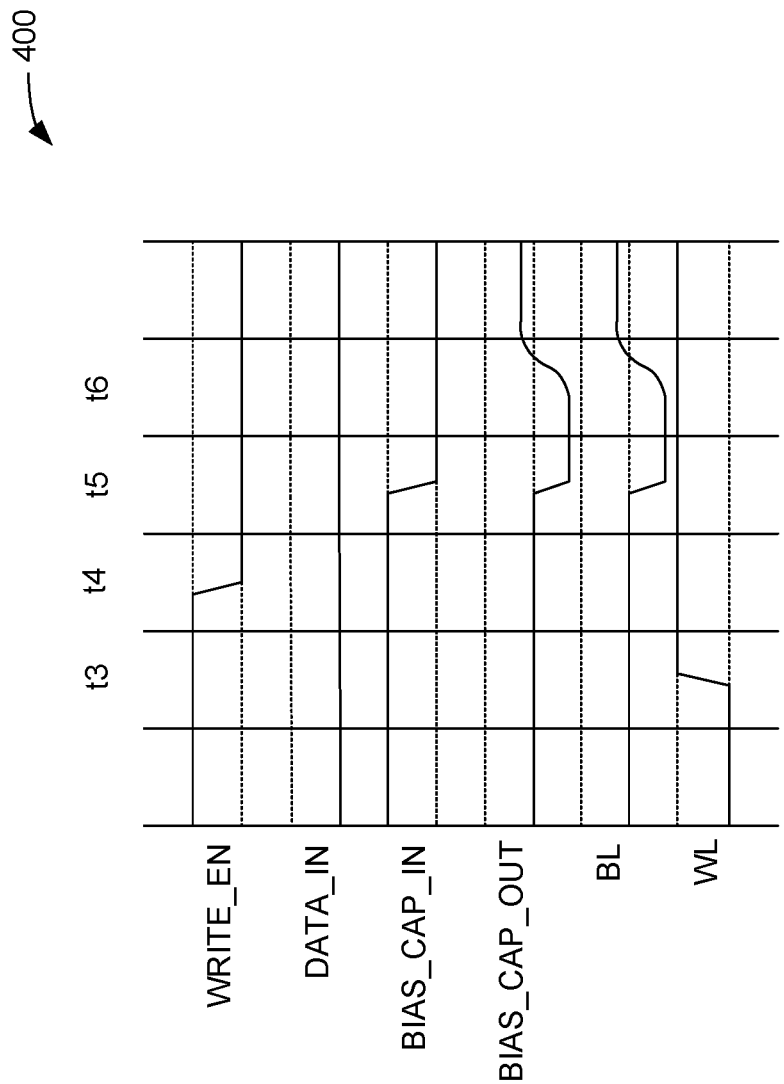
FIG. 4 is a timing diagram illustrating the operation of the memory circuit of FIG. 3, according to one embodiment.

FIG. 4 illustrates a timing diagram 400 showing an example of an operation of the memory circuit 300, according to one embodiment.

In a time segment t3, write enable signal WRITE_EN is logic level HIGH, so write driver 104 drives bitline signal BL to correspond with the logic level of data signal DATA_IN, logic level LOW. Because data signal DATA_IN is logic level LOW, bias capacitor output signal BIAS_CAP_OUT may be coupled to bitline signal BL through MUX switch 218a.

Additionally, in time segment t3, bias capacitor input signal BIAS_CAP_IN is logic level HIGH in response to write enable signal WRITE_EN being logic level high. Because bias capacitor input signal BIAS_CAP_IN is logic level HIGH and bias capacitor output signal BIAS_CAP_OUT is logic level low, the voltage across bias capacitor 216 is the difference between logic levels HIGH and LOW, e.g., 1 volt.

Wordline signal WL transitions from logic level LOW to logic level HIGH, so memory cell 106 may be electrically coupled to bitline signal BL to write the bitline signal BL to memory cell 106. Thus, in time segment t3, memory cell 106 is driven to a logic level LOW (e.g., ground reference or 0 volts), by coupling memory cell 106 to ground through write driver 104.

In a time segment t4, write enable signal WRITE_EN transitions from logic level HIGH to logic level LOW. As shown in FIG. 3, a LOW write enable signal WRITE_EN decouples bitlines 102 from voltage input terminals 116 and ground reference terminals 118. Accordingly, bitline signal BL may be floating, i.e., decoupled from voltage reference VCC and decoupled from the ground reference in time segments t4 through t6.

In a time segment t5, bias capacitor input signal BIAS_CAP_IN transitions from logic level HIGH to logic level LOW in response to the HIGH to LOW transition of write enable signal WRITE_EN in time segment t4. Bias capacitor 216 preserves the voltage (logic level HIGH-logic level LOW) across bias capacitor input terminal 214 and bias capacitor output terminal 220 while bias capacitor input signal BIAS_CAP_IN transitions from logic level HIGH to logic level LOW. As a result, bias capacitor output signal BIAS_CAP_OUT and bitline signal BL are driven to a negative voltage. This negative voltage is applied to memory cell 106 while wordline signal WL is logic level HIGH.

In a time segment t6, bitline signal BL and bias capacitor output signal BIAS_CAP_OUT pulling the datum of memory cell 106 to a negative voltage through capacitive charge sharing. According to one embodiment, the bias capacitor output signal BIAS_CAP_OUT and bitline signal BL may gradually charge from a negative voltage towards 0 volts through transistor current leakage.

Figure 5:
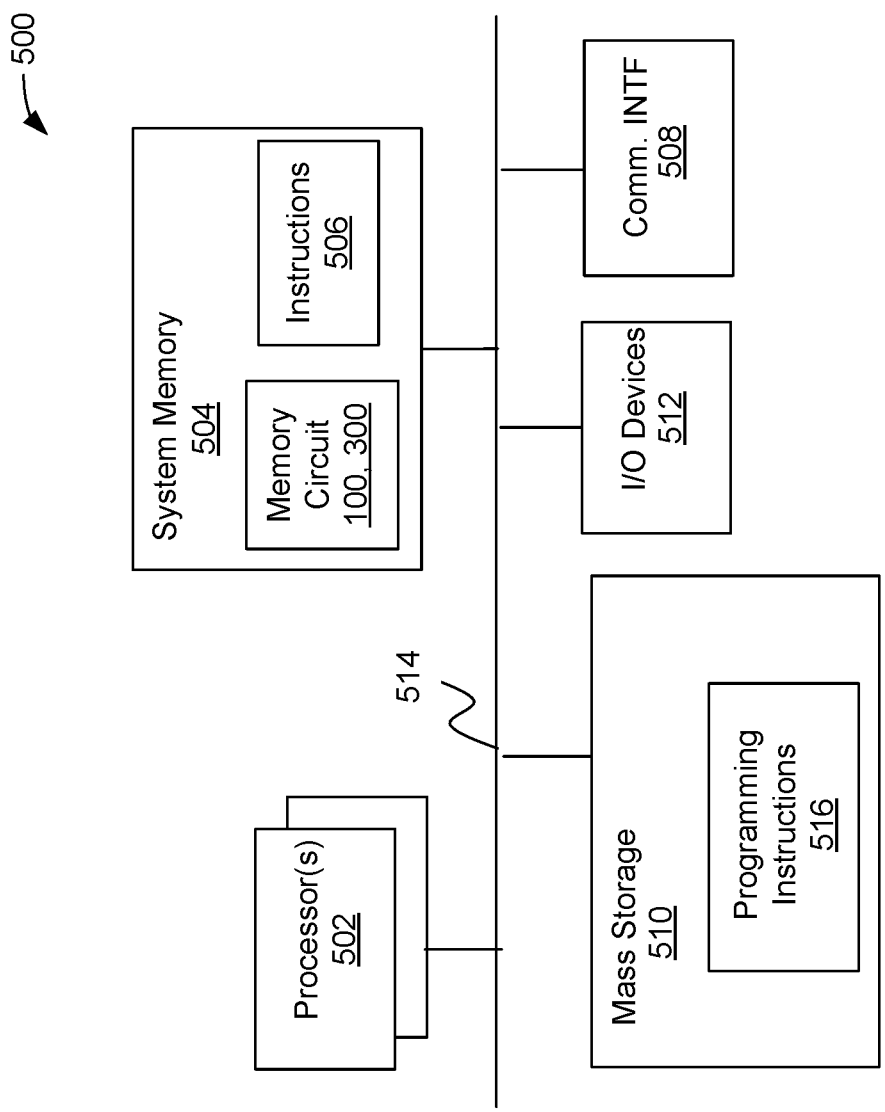
FIG. 5 is a block diagram of a computing device suitable for use to practice various embodiments.

FIG. 5 illustrates an example computing device 500 suitable to use either of memory circuit 100 and memory circuit 300, in accordance with various embodiments of the present disclosure. As shown, computing device 500 may include a number of processors or processor cores 502, a system memory 504, a communication interface 508, mass storage 510, and input/output (I/O) devices 512. For the purpose of this application, including the claims, the terms "processor" and "processor cores" may be considered synonymous, unless the context clearly requires otherwise.

System memory 504 may be employed to store a working copy and/or a permanent copy of programming instructions implementing one or more operating systems, firmware modules or drivers, applications, and so forth, herein collectively denoted as 506. System memory 504 may utilize memory circuit 100 and/or memory circuit 300 to store one or more working copies of instructions 506, according to various embodiments. Permanent copies of the instructions 506 may be placed into permanent storage in the factory, or in the field, through, for example, a distribution medium (not shown), such as a compact disc (CD), or through the communication interface 508 (from a distribution server (not shown)).

The mass storage 510 may comprise a tangible, non-transitory computer-readable storage device (such as a diskette, hard drive, compact disc read only memory (CDROM), hardware storage unit, and so forth). Mass storage 510 may include programming instructions 516 to cause process cores 502 to perform the various processes, such as executing an operating system.

Input/output devices 512 may include devices such as a keyboard, display screen, cursor control, and so forth, according to various embodiments.

The various elements of FIG. 5 may be coupled to each other via a system bus 514, which represents one or more buses. In the case of multiple buses, they may be bridged by one or more bus bridges (not shown). Data may pass through the system bus 514 via the processors 502.

According to various embodiments, one or more of the depicted components of computing device 500 and/or other element(s) may include a keyboard, LCD screen, non-volatile memory port, multiple antennas, graphics processor, application processor, speakers, or other associated mobile device elements, including a camera.

The remaining constitution of the various elements of computing device 500 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration, connection, and operation of certain elements in various embodiments may have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

Each of the embodiments discussed above may be fully or partially combined with all or part of each other embodiment disclosed above in order to produce additional embodiments.

These and other modifications can be made in light of the above detailed description. The terms used in the following claims should not be construed to be limited to the specific embodiments disclosed in the specification.

The following examples pertain to further embodiments.

For example, one embodiment provides an apparatus that includes: at least two bitlines having a respective voltage level, a bias capacitor that may be coupled between the at least two bitlines have an input terminal and an output terminal, the bias capacitor may be configured to transfer charge between the input terminal and the output terminal in response to a drive signal, and a multiplexer coupled between the at least two bitlines and the bias capacitor to selectively provide a conductive path between the output terminal of the bias capacitor and one of the at least two bitlines at a time, the multiplexer may be configured to enable charge transferred from the input terminal to the output terminal to alter the respective voltage level of one of the at least two bitlines.

According to one embodiment of the apparatus, the multiplexer may selectively provide the conductive path in response to a control signal received from a memory write driver.

According to one embodiment of the apparatus, the multiplexer may include an N-channel metal oxide semiconductor field effect transistors (MOSFET).

According to one embodiment of the apparatus, the bias capacitor may include a MOSFET, the output terminal may include a gate terminal of the MOSFET, and the input terminal may include a source terminal of the MOSFET conductively coupled to a drain terminal of the MOSFET.

According to one embodiment of the apparatus, the bias capacitor may be configured to selectively drive one of the at least two bitlines to a negative voltage level.

According to one embodiment of the apparatus, VCC is a supply voltage level and the bias capacitor may be configured to selectively drive the negative voltage level to at least −½ VCC.

As another example, one embodiment provides a ballast circuit that includes: a bias capacitor having an input terminal and an output terminal, the output terminal of the bias capacitor may be coupled between a first bitline and a second bitline, the bias capacitor may be configured to selectively drive one of the first bitline and the second bitline to a negative voltage level in response to a ballast control signal received at the input terminal from a memory write driver, and a multiplexer having a first transistor and a second transistor, the first transistor may be coupled between the output terminal and the first bitline, the second transistor may be coupled between the output terminal and the second bitline, the first transistor may be configured to be in a first conductive state while the second transistor is in a second conductive state, the second transistor may be configured to be in the first conductive state while the first transistor is in the second conductive state, the first transistor may be configured to switch between the first and second conductive states in response to a first control signal received from the memory write driver.

According to one embodiment of the ballast circuit, the first transistor and the second transistor include N-channel metal oxide semiconductor field effect transistors (MOSFETs).

According to one embodiment of the ballast circuit, the bias capacitor includes a P-channel MOSFET, the output terminal includes a gate terminal of the P-channel MOSFET, and the input terminal includes a drain terminal of the P-channel MOSFET conductively coupled to a source terminal of the P-channel MOSFET.

According to one embodiment of the ballast circuit, the bias capacitor has a capacitance that is approximately the same as a capacitance of one of the first bitline and the second bitline.

According to one embodiment of the ballast circuit, the first conductive state is substantially conducting current and the second conductive state is substantially impeding current.

As another example, one embodiment provides a system including: a number of memory cells each configured to store at least one bit of datum, a write driver configured to selectively provide the at least one bit of datum to the number of memory cells in response to receipt of a write enable signal and a data input signal, a first bitline and a second bitline configured to communicatively couple the write driver to the number of memory cells, and a ballast circuit electrically coupled between the first bitline and the second bitline. The ballast circuit may include: a bias capacitor having an input terminal and an output terminal. The output terminal may be coupled between the first bitline and the second bitline. The bias capacitor may be configured to selectively drive one of the first bitline and the second bitline to a negative voltage level in response to a ballast control signal received at the input terminal from the memory write driver. The ballast circuit may also include a multiplexer having a first transistor and a second transistor. The first transistor may be coupled between the output terminal and the first bitline. The second transistor may be coupled between the output terminal and the second bitline. The first transistor may be configured to be in a first conductive state while the second transistor is in a second conductive state. The second transistor may be configured to be in the first conductive state while the first transistor is in the second conductive state. The first transistor may be configured to switch between first and second conductive states in response to a first control signal received from the memory write driver.

According to one embodiment of the system, each of the plurality of memory cells are two-port memory cells.

According to one embodiment of the system, the memory write driver is coupled directly to a ground reference without a pull-down transistor.

According to one embodiment of the system, the first conductive state is substantially conducting current and the second conductive state is substantially impeding current.

According to one embodiment, the system may further include a plurality of ballast circuits electrically coupled between the first bitline and the second bitline and configured to selectively drive one of the first bitline and the second bitline to the negative voltage level to facilitate writing a bit of datum to at least one of the plurality of memory cells.

As another example, one embodiment may provide a method including: driving, with a memory cell write driver, a bitline from a first logic level to a second logic level different from the first logic level, decoupling the bitline, by the memory cell write driver, from a voltage supply of the memory cell write driver and from a ground reference of the memory cell write driver to temporarily preserve the second logic level driven onto the bitline, and driving, with a ballast circuit coupled directly to the bitline, the bitline to a negative voltage level, while the bitline is decoupled from the voltage supply and the ground reference, in response to receiving ballast control signal at the ballast circuit from the memory cell write driver.

According to one embodiment of the method, the decoupling the bitline includes turning OFF a number of transistors in the memory cell write driver in response to a write enable signal transitioning from a first logic level to a second logic level at an input of the memory cell write driver.

According to one embodiment of the method, the first logic level is logic HIGH and the second logic level is logic LOW.

According to one embodiment, the method may further include: receiving a multiplexer control signal, from the memory cell write driver, at a multiplexer transistor of the ballast circuit, and selectively coupling a bias capacitor of the ballast circuit to the bitline with the multiplexer transistor, in response to receiving the multiplexer control signal, to pump charge onto the bitline to drive the bitline to the negative voltage level.

What is claimed is:

1. An apparatus comprising:
   one or more memory cells;
   a first bit-line coupled to the one or more memory cells;
   a second bit-line coupled to the one or more memory cells;
   a first circuitry configured to provide negative bit-line write assist to the first and second bit-lines, wherein the first circuitry comprises:
      a first driver and a second driver, wherein the first driver is directly coupled to the first bit-line, wherein the first driver comprises:
         a first p-type transistor with a first source terminal coupled to a power supply node, and a first drain terminal directly connected to the first bit-line, and
         wherein the second driver is coupled to the second bit-line, and wherein the second driver comprises a second p-type transistor with a second source terminal coupled to the power supply node, and a second drain terminal directly connected to the second bit-line; and
      a capacitive device coupled to the first and second drivers;
   a second circuitry coupled to the capacitive device of the first circuitry; and
   a third circuitry to drive the first and second drivers of the first circuitry,
   wherein the first circuitry is configured to reduce capacitive effect on the first and second bit-lines; and
   wherein the capacitive device comprises a transistor having source and drain terminals coupled together.

2. The apparatus of claim 1, wherein the one or more memory cells comprise SRAMs.

3. The apparatus of claim 1, wherein the second circuitry comprises at least two inverters coupled in series.

4. The apparatus of claim 1, wherein the first and second drivers of the first circuitry comprise first and second n-type transistors, respectively.

5. A system, comprising:
   one or more processors;
   a display coupled with one or more of the one or more processors;
   one or more antennas coupled with one or more of the one or more processors; and
   a memory circuit coupled with one or more of the one or more processors, wherein the memory circuit includes:
      one or more memory cells;
      a first bit-line coupled to the one or more memory cells;
      a second bit-line coupled to the one or more memory cells;
      a first circuitry configured to provide negative bit-line write assist to the first and second bit-lines, wherein the first circuitry comprises:
         a first driver and a second driver, wherein the first driver is directly coupled to the first bit-line, wherein the second driver is coupled to the second bit-line, and wherein the first driver comprises a first p-type transistor with a first source terminal coupled to a power supply node, and a first drain terminal directly connected to the first bit-line, wherein the second driver comprises a second p-type transistor with a second source terminal coupled to the power supply node, and a second drain terminal directly connected to the second bit-line; and
         a capacitive device coupled to the first and second drivers;
      a second circuitry coupled to the capacitive device of the first circuitry; and
      a third circuitry to drive the first and second drivers of the first circuitry,
      wherein the first circuitry is configured to reduce capacitive effect on the first and second bit-lines; and
      wherein the capacitive device comprises a transistor having source and drain terminals coupled together.

6. The system of claim 5, wherein the one or more memory cells comprise SRAMs.

7. The system of claim 5, wherein the second circuitry comprises at least two inverters coupled in series.

8. The system of claim 5, wherein the first and second drivers of the first circuitry comprise first and second n-type transistors, respectively.

9. An apparatus comprising:
   a first bit-line coupled to one or more memory cells;
   a second bit-line coupled to the one or more memory cells;
   a first circuitry configured to reduce capacitive effect on the first and second bit-lines, wherein the first circuitry comprises:
      a first transistor having source and drain terminals coupled together;
      a second transistor coupled to the first bit-line and the first transistor; and
      a third transistor coupled to the second bit-line and the first transistor;
   an inverter coupled to the first transistor of the first circuitry;
   a first driver comprising a first p-type transistor with a first source terminal coupled to a power supply node, and a first drain terminal directly connected to the first bit-line and the second transistor;
   a second driver comprising a second p-type transistor with a second source terminal coupled to the power supply node, and a second drain terminal directly connected to the second bit-line and the third transistor; and
   a second circuitry to drive the second and third transistors of the first circuitry, wherein the first transistor is directly connected to the second circuitry.

10. The apparatus of claim 9, wherein the one or more memory cells comprise SRAMs.

11. The apparatus of claim 9, wherein the first circuitry is to provide negative bit-line write assist to the first and second bit-lines.

12. The apparatus of claim 9, wherein the second and third transistors are n-type transistors.

13. The apparatus of claim 9, wherein the second and third transistors are controllable by input data.

14. The apparatus of claim 9, wherein the third transistor is to receive input data.

15. An apparatus comprising:
a first bit-line coupled to one or more memory cells;
a second bit-line coupled to the one or more memory cells;
a first circuitry configured to reduce capacitive effect on the first and second bit-lines, wherein the first circuitry comprises:
  a p-type transistor having source and drain terminals connected together;
  a first n-type transistor connected to the first bit-line and a gate of the p-type transistor; and
  a second n-type transistor connected to the second bit-line and the gate of the p-type transistor;
an inverter connected to drain and source terminals of the p-type transistor of the first circuitry;
a first driver comprising:
  a first p-type transistor with a first source terminal coupled to a power supply node, and a first drain terminal directly connected to the first bit-line and the first n-type transistor;
a second driver comprising:
  a second p-type transistor with a second source terminal coupled to the power supply node, and a second drain terminal directly connected to the second bit-line and the second n-type transistor; and
a second circuitry to drive the first and second n-type transistors of the first circuitry, wherein the p-type transistor is directly connected to the second circuitry.

16. The apparatus of claim 15, wherein:
the one or more memory cells comprise SRAMs;
the first circuitry is to provide negative bit-line write assist to the first and second bit-lines;
the second bit-line is to carry a signal which is a complement of a signal on the first bit-line; and
the first and second n-type transistors are controllable by input data.

17. The apparatus of claim 16, wherein the second n-type transistor is to receive input data.

18. An apparatus comprising:
a first bit-line coupled to one or more memory cells;
a second bit-line coupled to the one or more memory cells;
a first circuitry configured to reduce capacitive effect on the first and second bit-lines, wherein the first circuitry comprises:
  a capacitive device having source and drain terminals connected together;
  a first n-type transistor having a source terminal connected to the first bit-line, and a drain terminal coupled to a gate of the capacitive device; and
  a second n-type transistor having a source terminal connected to the second bit-line, and a drain terminal coupled to the gate of the capacitive device;
a first inverter connected to the drain and source terminals of the capacitive device;
a first driver comprising:
  a first p-type transistor with a first source terminal coupled to a power supply node, and a first drain terminal directly connected to the first bit-line, wherein a gate terminal of the first p-type transistor is coupled to an output of a second inverter; and
  a first n-type transistor with a first source terminal coupled to a ground supply node, and a first drain terminal directly connected to the first bit-line and the first p-type transistor of the first driver, wherein a gate terminal of the first n-type transistor is coupled to an input of a third inverter; and
a second driver comprising:
  a second p-type transistor with a second source terminal coupled to the power supply node, and a second drain terminal directly connected to the second bit-line, wherein a gate terminal of the second p-type transistor is coupled to an output of third inverter; and
  a second n-type transistor with a second source terminal coupled to the ground supply node, and a second drain terminal directly connected to the second bit-line and the second p-type transistor of the second driver, wherein a gate terminal of the second n-type transistor is coupled to an input of the second inverter.

19. The apparatus of claim 18 comprising a second circuitry to drive the first and second n-type transistors of the first circuitry.

20. The apparatus of claim 19, wherein the second circuitry includes:
A first NOR gate to drive the first n-type transistor and the third inverter; and
A second NOR gate to drive the second n-type transistor and the second inverter.

21. The apparatus of claim 18, wherein the one or more memory cells comprises SRAM bit-cells.

* * * * *